United States Patent
Yoshida et al.

(10) Patent No.: US 9,064,616 B2
(45) Date of Patent: Jun. 23, 2015

(54) CONDUCTIVE PASTE

(75) Inventors: Hiroshi Yoshida, Tosu (JP); Naoto Shindo, Tosu (JP); Tadashi Kanasaku, Tosu (JP); Shoko Masuda, Tokyo (JP)

(73) Assignee: Shoei Chemical Inc., Tokyo (JP)

( * ) Notice: Subject to any disclaimer, the term of this patent is extended or adjusted under 35 U.S.C. 154(b) by 133 days.

(21) Appl. No.: 14/005,994

(22) PCT Filed: Apr. 5, 2012

(86) PCT No.: PCT/JP2012/059391
§ 371 (c)(1),
(2), (4) Date: Sep. 18, 2013

(87) PCT Pub. No.: WO2012/144335
PCT Pub. Date: Oct. 26, 2012

(65) Prior Publication Data
US 2014/0008587 A1    Jan. 9, 2014

(30) Foreign Application Priority Data
Apr. 21, 2011    (JP) .................. 2011-094666

(51) Int. Cl.
| | | |
|---|---|---|
| H01B 1/22 | (2006.01) | |
| H01L 31/00 | (2006.01) | |
| C03C 8/18 | (2006.01) | |
| C09D 5/24 | (2006.01) | |
| C03C 8/02 | (2006.01) | |
| H01L 31/0224 | (2006.01) | |

(52) U.S. Cl.
CPC .. H01B 1/22 (2013.01); C09D 5/24 (2013.01); C03C 8/02 (2013.01); C03C 8/18 (2013.01); H01L 31/022425 (2013.01); *Y02E 10/50* (2013.01)

(58) Field of Classification Search
CPC .... H01B 1/16; H01B 1/22; H01L 31/022425; H01L 35/14; H01L 35/24; C03C 8/18; C03C 4/14; C03C 14/006; C09D 5/24; H05K 1/092; H05K 1/0296
See application file for complete search history.

(56) References Cited

U.S. PATENT DOCUMENTS

| | | |
|---|---|---|
| 2009/0188555 A1 | 7/2009 | Castillo et al. |
| 2009/0189126 A1 | 7/2009 | Prunchak |
| 2009/0199897 A1 | 8/2009 | Naito et al. |
| 2011/0232746 A1* | 9/2011 | Carroll et al. ................ 136/256 |
| 2013/0098431 A1* | 4/2013 | Chen et al. .................... 136/252 |
| 2014/0004649 A1* | 1/2014 | Nakamura et al. ............. 438/72 |

FOREIGN PATENT DOCUMENTS

| | | | |
|---|---|---|---|
| JP | 02-293344 | 12/1990 | |
| JP | 04-270140 | 9/1992 | |
| JP | 10-029834 | 2/1998 | |
| JP | 10-326522 | 12/1998 | |
| JP | 2001-118425 | 4/2001 | |
| JP | 2007-008802 | 1/2007 | |
| JP | 2008-543080 | 11/2008 | |
| JP | 2009-194121 | 8/2009 | |
| JP | 2010-184852 | 8/2010 | |
| JP | 2011-096747 | 5/2011 | |
| JP | 2012-084585 | 4/2012 | |
| KR | 101149812 | * | 5/2012 |
| WO | WO 2009-097264 | 8/2009 | |

OTHER PUBLICATIONS

European Substantive Office Action issued in Application No. EP 12 77 4898 dated Oct. 24, 2014 (4 pagesP.
International Search Report of PCT/JP2012/059391 (2 pages) mailed Jun. 5, 2012.

* cited by examiner

*Primary Examiner* — Mark Kopec
(74) *Attorney, Agent, or Firm* — Flynn, Thiel, Boutell & Tanis, P.C.

(57) ABSTRACT

A conductive paste includes a conductive powder containing at least one of copper and nickel as a main component, a glass frit, and an organic vehicle, wherein the glass frit is a tellurium-based glass frit that essentially does not contain any lead component and contains tellurium as a network former in an amount of 35 to 70 mol % in terms of oxide, the tellurium-based glass frit containing silver as an essential component. The above conductive paste can provide favorable characteristics and favorably be used in the formation of light-receiving surface electrodes of a solar cell element even when the conductive paste includes one or more of copper and nickel as its conductive component.

4 Claims, No Drawings

CONDUCTIVE PASTE

TECHNICAL FIELD

The present invention relates to a fired-type conductive paste that can favorably be used particularly in the formation of electrodes of a solar cell element.

BACKGROUND ART

A conventional, ordinary solar cell element is provided with a silicon semiconductor substrate, an n-type diffusion layer, an antireflective film, a rear surface electrode, and a front surface electrode. When forming the front surface electrode, an electrode pattern is formed by screen printing, stencil printing or the like using a conductive paste made by mixing conductive particles composed mainly of silver with glass frit, an organic vehicle, and the like. Thereafter, this electrode pattern is fired to form the electrode.

The increased environmental awareness in recent years has led to a desire for switching to lead-free materials and parts in solar cells.

Examples of lead-free glass include the zinc borosilicate glass frit described in Patent Document 1, the bismuth borosilicate glass frit and zinc borosilicate glass frit described in Patent Document 2, the borosilicate glass frit described in Patent Document 3, and the zinc borate glass frit described in Patent Document 4.

On the other hand, as an example of glass that can be fired at low temperatures, tellurium-based glass is known for use in fluorescent display tube sealing applications (Patent Document 5) and optical fiber material applications (Patent Document 6). However, the field of application of such tellurium-based glass is limited, and the use of tellurium-based glass in the formation of a conductor was rarely taken into consideration in the past. In addition, as a glass composition for a die-bonding adhesive, Patent Documents 7 and 8, for example, describe the use of tellurium-containing glass that can be fired at low temperature. Unfortunately, such glass contains a large amount of lead as an essential component, which is problematic in terms of environment and safety.

Focusing on such tellurium-based glass, the applicant of the present invention confirms that the use of a conductive paste containing tellurium-based glass to form an electrode of a solar cell element can lead to achievement of significant effects (Japanese Patent Application No. 2009-247220: referred to as "specification of the prior application," hereinafter).

The present invention was contrived as a result of further research on this tellurium-based glass. In other words, although the conductive paste described in the abovementioned specification of the prior application uses silver as a conductive component, the inventors of the present invention had discovered that the excellent characteristics can be realized by a specific type of tellurium-based glass even if it contains copper or nickel as a conductive component, and thereby accomplished the present invention.

CITATION LIST

Patent Literature

Patent Document 1: Japanese Patent Application Publication No. 2001-118425
Patent Document 2: Japanese Patent Application publication No. 10-326522
Patent Document 3: Japanese Patent Application Publication (Translation of PCT Application) No. 2008-543080
Patent Document 4: Japanese Patent Application Publication No. 2009-194121
Patent Document 5: Japanese Patent Application Publication No. 10-029834
Patent Document 6: Japanese Patent Application Publication No. 2007-008802
Patent Document 7: Japanese Patent Application Publication No. 02-293344
Patent Document 8: Japanese Patent Application Publication No. 04-270140

SUMMARY OF INVENTION

Technical Problem

An object of the present invention is to provide a conductive paste that can provide its favorable characteristics and favorably be used in the formation of electrodes of a solar cell element even when the conductive paste includes copper or nickel as its conductive component.

Solution to Problem

The present invention has the following configurations.
(1) A conductive paste comprising a conductive powder containing at least one of copper and nickel as a main component, a glass frit, and an organic vehicle, wherein the glass frit is a tellurium-based glass frit that essentially does not contain any lead component and contains tellurium as a network former in an amount of 35 to 70 mol % in terms of oxide, the tellurium-based glass frit containing silver as an essential component.
(2) The conductive paste as in (1) described above, wherein the tellurium-based glass frit contains the silver in an amount of 3 to 40 mol % in terms of oxide in proportion to the entire tellurium-based glass frit.
(3) The conductive paste as in (1) or (2) described above, wherein the tellurium-based glass frit contains at least one of tungsten and molybdenum.
(4) The conductive paste as in any one of (1) to (3) described above, which is used in the formation of an electrode of a solar cell.

Advantageous Effects of Invention

According to the present invention, in the conductive paste that uses the conductive powder containing at least one of copper and nickel as a main conductive component, the use of the tellurium-based glass frit containing silver can form an electrode having excellent characteristics. The conductive paste according to the present invention can favorably be used particularly in the formation of a front surface (light-receiving surface) electrode of a solar cell. An electrode exerting excellent solar cell characteristics can be obtained by printing and firing the paste onto an antireflective film of silicon nitride or the like of a solar cell surface.

EMBODIMENTS FOR CARRYING OUT THE INVENTION

An embodiment of the conductive paste according to the present invention is described hereinafter. However, the present invention is not limited to this embodiment.

The conductive paste according to the present invention is described first. In the conductive paste of the present invention, the conductive powder containing one or more of copper and nickel as a main component and a glass frit are dispersed in an organic vehicle. The individual components are described next.

The conductive powder comprises one or more of copper and nickel as a main component, and has a spherical-shape, a flake-like shape, a dendrite-shape, etc., as used in the prior art. The conductive powder is not limited to pure copper powder or pure nickel powder, and may be composite powder, alloy powder, mixed powder or the like, containing copper and/or nickel as a main component as well as other metals. There are no particular limitations on the metals to be compounded, alloyed or mixed with the copper and/or nickel which is the main component, and examples of such metals include zinc, tin, aluminum, tungsten, molybdenum, manganese, phosphorous, silicon, titanium, indium, antimony, chromium, silver, gold, palladium, etc. The conductive powder preferably has an average particle size of 0.1 to 10 μm. Further, two or more types of conductive powders of different metals, average particle sizes, particle size distributions, shapes, etc., may be mixed. Note that the main component described in the present invention means a component that accounts for more than 50 wt % of the components of the conductive powder. The total content of the copper and/or nickel in the conductive powder is preferably 70 wt % or more.

In the present invention, a tellurium-based glass containing tellurium as a network former is used as the glass frit. Tellurium of the tellurium-based glass does not form glass by itself but functions as a network former for forming the principal structure of glass. The tellurium-based glass frit contains tellurium in an amount of 35 to 70 mol % in terms of oxide in proportion to the entire tellurium-based glass frit. Forming the glass becomes difficult when the content of tellurium is less than 35 mol % or exceeds 70 mol %. More preferably, the content of tellurium is 40 to 60 mol %.

As described in the specification of the prior application, forming a front surface electrode of a solar cell by using the conductive paste containing the tellurium-based glass can not only prevent the occurrence of deep penetration of the front surface electrode into a semiconductor substrate, but also enable easy control of fire-through and obtain sufficient ohmic contact.

However, the research by the inventors of the present invention shows that when copper and/or nickel is included as the main conductive component in the conductive paste, the contact resistance of an electrode formed becomes high and it is difficult to obtain excellent solar cell characteristics even with the use of the tellurium-based glass.

According to the present invention, therefore, the conductive paste that contains the conductive powder including copper and/or nickel as a main conductive component is characterized in using tellurium-based glass that contains silver as an essential component. Even when copper and/or nickels is used as the conductive powder, the use of the tellurium-based glass containing silver can dramatically reduce the contact resistance of a solar cell electrode that is formed using the conductive paste of the present invention.

The silver content below 3 mol % in terms of oxide in the tellurium-based glass cannot achieve the effect of containing silver. Although the tellurium-based glass has a feature that provides very high silver solid solubility, the silver content around 40 mol % or exceeding 40 mol % easily causes a precipitation of the silver component in the glass. In some cases, the glass can be used without serious problems, even with the silver component precipitated therein. In the present invention, however, it is preferred that the silver be contained in an amount of 3 to 40 mol % in terms of oxide in proportion to the entire tellurium-based glass frit, from the standpoint of the stability of the glass. It is further preferred that the silver content be 15 to 35 mol % in order to obtain more favorable solar cell characteristics. The silver mentioned above is contained as a glass component in the tellurium-based glass; thus, the effects described above cannot be obtained with tellurium-based glass that does not contain silver as a glass component.

In the tellurium-based glass used in the present invention, tellurium is used as a network former to form a glass network, but it is preferred that the tellurium-based glass contain, in addition to tellurium, one or more of tungsten and molybdenum as a component for supplementing formation of the glass network. It is further preferred that the tellurium-based glass contain one or more of bismuth, zinc, and aluminum as a component for improving or adjusting the characteristics of glass.

Both tungsten and molybdenum contribute to expanding the vitrification range of the tellurium-based glass and stabilizing the glass. Vitrification becomes difficult if the total content of tungsten and molybdenum as oxides is less than 5 mol % or more than 60 mol %. The preferred range of the total content of tungsten and molybdenum is therefore 10 to 40 mol %.

Bismuth contributes to expanding the vitrification range and improving the chemical durability, but a crystal phase is likely to precipitate when the bismuth content in terms of oxide exceeds 25 mol %, detracting from the stability of the glass. Zinc contributes to expanding the vitrification range and stabilizing, but vitrification becomes difficult when the zinc content in terms of oxide exceeds 50 mol %. Aluminum contributes to improving the chemical durability of the glass. However, when the addition of aluminum as oxide exceeds 25 mol %, a significant effect by the addition cannot be achieved.

It is preferred that bismuth, zinc and aluminum be contained as oxides in the tellurium-based glass of the present invention in a total amount of 5 to 20 mol %.

The tellurium-based glass according to the present invention may further include one or more of alkali metal elements such as potassium, lithium and sodium, alkali earth metal elements such as magnesium, calcium, strontium and barium, and the other elements such as dysprosium, yttrium, niobium, lanthanum, zirconium, titanium, boron, germanium, phosphorus, tantalum, and vanadium.

The following examples describe tellurium-tungsten-bismuth-based glass with silver and tellurium-molybdenum-bismuth-based glass with silver, as typical or favorable examples of the tellurium-based glass; however, the tellurium-based glass that can be used in the present invention is not limited thereto. For instance, the present invention can use glass obtained by mixing silver as a glass component into, for example, various types of tellurium-based glass described in the specification of the prior application.

In addition to the silver-containing tellurium-based glass frit, glass frit other than the tellurium-based glass may be combined in the conductive paste of the present invention in order to adjust the characteristics of the conductive paste. As the glass frit other than the tellurium-based glass, glass selected from among known glasses such as $SiO_2$—$B_2O_3$ glass, $SiO_2$—$B_2O_3$—$ZnO$ glass, $SiO_2$—$Bi_2O_3$ glass, $SiO_2$—$Bi_2O_3$—$ZnO$ glass, $B_2O_3$—$ZnO$ glass, and the like can appropriately be combined with the tellurium-based glass, and it is especially desirable to include $SiO_2$—$B_2O_3$ glass, $SiO_2$—$B_2O_3$—$ZnO$ glass, $SiO_2$—$Bi_2O_3$ glass, or $SiO_2$—$Bi_2O_3$—$ZnO$ glass.

The glass frit may be contained in the conductive paste of the present invention, in an amount normally contained in conductive paste; however, 0.1 to 10 parts by weight, for example, per 100 parts by weight of conductive powder is preferred. When the amount of the glass frit is less than 0.1 part by weight per 100 parts by weight of conductive powder, adhesiveness to the substrate and electrode strength will be very low. If it exceeds 10 parts by weight, on the other hand, there will be problems with glass float on the electrode surface and increased contact resistance due to glass flowing into the interface.

The average particle size of the glass frit added in the conductive paste of the present invention is not particularly limited but is preferably 0.5 to 5.0 μm.

Note that the tellurium-based glass frit used in the present invention essentially does not contain any lead component, but the lead content is, specifically, 1000 ppm or less.

The conductive paste of the present invention can be further added with, if necessary, plasticizers, viscosity adjusters, surfactants, oxidizers, metal oxides, organic metal compounds and the like, commonly used as additives, to an extent not deteriorating the effects of the present invention. A silver compound such as silver carbonate, silver oxide, or silver acetate described in Japanese Patent Application Publication No. 2007-242912 filed by the applicant of the present invention may also be added. In addition, copper oxide, zinc oxide, titanium oxide and the like may also be added appropriately to the conductive paste in order to control the firing temperature or improve the solar cell characteristics.

The conductive paste of the present invention is formed by mixing the aforementioned conductive powder, glass frit and appropriate additives together with an organic vehicle and uniformly dispersing these components in the organic vehicle to obtain a paste, paint or ink with a rheology suited to screen printing or other printing method.

The organic vehicle is not particularly limited, and an organic binder, solvent, or the like commonly used as a vehicle in conductive pastes can be selected and mixed in the conductive paste as appropriate. Examples of organic binders include celluloses, acrylic resins, phenol resins, alkyd resins, rosin esters and the like, while examples of solvents include alcohols, ethers, esters, hydrocarbons and other organic solvents as well as water and mixed solvents thereof. The amount of the organic vehicle to be added to the conductive paste is not particularly limited, and is adjusted appropriately, in accordance with the application method, to an amount appropriate for retaining inorganic components such as the conductive powder and the glass frit in the paste, but is normally 5 to 40 parts by weight per 100 parts by weight of the conductive powder.

The solar cell element to which the conductive paste of the present invention can be applied is manufactured in, for example, the following manner.

The semiconductor substrate is preferably composed of monocrystalline silicon or multicrystalline silicon and doped with, for example, boron or the like to exhibit one conductivity type (e.g., p-type). A diffusion layer is formed by diffusing phosphorus atoms or the like into the light-receiving surface of the semiconductor substrate, thereby forming a region exhibiting the opposite conductivity type (e.g., n-type), onto which an antireflective film of silicon nitride or the like is provided. An aluminum paste, silver paste, or silver-aluminum paste is applied onto the substrate surface opposite the light-receiving surface, and then dried to form a rear surface electrode and a high-concentration p-type back surface field layer (BSF layer). The conductive paste of the present invention is then applied onto the abovementioned antireflective film by a conventional method such as a screen printing method, dried, and then fired for a total firing time of approximately 1 to 30 minutes at a high temperature with a peak temperature of 500 to 900° C. in an reducing atmosphere or neutral atmosphere, to decompose and volatilize the organic vehicle components and form the front surface electrode, rear surface electrode, and BSF layer simultaneously. Note that the front surface electrode and the rear surface electrode do not have to be fired simultaneously; thus, the front surface electrode may be formed after the rear surface electrode is fired, or the rear surface electrode may be formed after the front surface electrode is fired. It is preferred that the light-receiving surface of the semiconductor substrate have a textured structure with a concave-convex surface (or pyramid-like asperities) in order to obtain high photoelectric conversion efficiency.

EXAMPLES

The present invention is specifically described hereinafter by means of examples, but the present invention is not limited to these examples.

First, the ingredients were mixed to obtain the metal oxide compositions shown in Table 1, and each of the resultant mixtures was melted at 700 to 900° C. using an alumina crucible, which was then poured onto graphite and air-cooled. The resultant glasses were finely pulverized in a zirconium ball mill, thereby obtaining glass frits A to N. The contents of the respective components of the glass compositions are shown in mol % in terms of oxides. Note that the glass frits A, I, M and N are outside the scope of the present invention. Slight precipitation of silver was observed in the glass frits H and L.

TABLE 1

| Glass | Glass composition [mol %] | | | | | | |
|---|---|---|---|---|---|---|---|
| | Te | W | Mo | Bi | Zn | Si | Ag |
| *A | 60 | 25 | 0 | 15 | 0 | 0 | 0 |
| B | 57 | 24 | 0 | 14 | 0 | 0 | 5 |
| C | 55 | 23 | 0 | 14 | 0 | 0 | 9 |
| D | 50 | 21 | 0 | 13 | 0 | 0 | 17 |
| E | 46 | 19 | 0 | 12 | 0 | 0 | 23 |
| F | 43 | 18 | 0 | 11 | 0 | 0 | 29 |
| G | 40 | 17 | 0 | 10 | 0 | 0 | 33 |
| H | 38 | 16 | 0 | 9 | 0 | 0 | 38 |
| *I | 60 | 0 | 30 | 10 | 0 | 0 | 0 |
| J | 57 | 0 | 29 | 10 | 0 | 0 | 5 |
| K | 50 | 0 | 25 | 8 | 0 | 0 | 17 |
| L | 38 | 0 | 19 | 6 | 0 | 0 | 38 |
| *M | 0 | 0 | 0 | 60 | 20 | 20 | 0 |
| *N | 0 | 0 | 0 | 57 | 19 | 19 | 5 |

*outside the scope of the present invention

[Production and Evaluation of Samples 1 to 12]

Copper powder in an amount of 100 parts by weight and each of the glass frits A to L in an amount of 2 parts by weight were dispersed together in 8 parts by weight of organic vehicle composed of 1.6 parts by weight of ethyl cellulose and 6.4 parts by weight of butyl carbitol, to produce each conductive paste of Samples 1 to 12.

Using each conductive paste of Samples 1 to 12, contact resistances were measured as follows by the TLM (transmission line model) method.

First of all, ten of 2 cm×2 cm square-shaped p-type silicon substrates with a pyramidal texture formed by alkali etching were prepared for each of the samples. Then, phosphorus was diffused into one principal surface for each substrate to form an n-type region (a diffusion layer), and a SiN layer was formed thereon by means of a plasma CVD method to an average thickness of 75 nm.

Thereafter, a plurality of thin line-shaped front surface electrodes with a width of 100 μm and a thickness of 15 μm were formed on the SiN layer with a pitch of 2 mm, using each of these produced Samples 1 to 12. The resistance values between the line-shaped electrodes were measured with a digital multimeter (3458A MULTIMETER by Hewlett-Packard Development Company, L.P.), to obtain the contact resistances. Note that the conductive pastes were fired in a non-oxidizing atmosphere at a peak temperature of 800° C.

The results are shown in Table 2. Note that the values shown in the "contact resistance" column in the table are average values.

As shown in Table 2, the contact resistances were improved when the silver-containing tellurium-based glass was used for the conductive pastes that used copper as a conductive component.

TABLE 2

|  | Conductive component | Glass | Contact resistance [Ω · cm$^2$] |
|---|---|---|---|
| *Sample 1 | Cu | *A | 1.20 |
| Sample 2 | Cu | B | 0.75 |
| Sample 3 | Cu | C | 0.42 |
| Sample 4 | Cu | D | 0.24 |
| Sample 5 | Cu | E | 0.11 |
| Sample 6 | Cu | F | 0.11 |
| Sample 7 | Cu | G | 0.09 |
| Sample 8 | Cu | H | 0.10 |
| *Sample 9 | Cu | *I | 0.60 |
| Sample 10 | Cu | J | 0.08 |
| Sample 11 | Cu | K | 0.15 |
| Sample 12 | Cu | L | 0.12 |
| *Sample 13 | Ni | *A | 0.60 |
| Sample 14 | Ni | F | 0.13 |
| *Sample 15 | Cu | *M | 13.43 |
| *Sample 16 | Cu | *N | 4.87 |

*outside the scope of the present invention

[Production and Evaluation of Samples 13 and 14]

Next, in the same manner as Samples 1 to 12, Samples 13 and 14 were produced except that nickel powder was used as the conductive powder, and the contact resistances thereof were obtained. The results are shown in Table 2.

As shown in Table 2, the contact resistances were improved when the silver-containing tellurium-based glass was used for the conductive pastes that use nickel as a conductive component.

[Production and Evaluation of Samples 15 and 16]

In the same manner as Samples 1 to 12, Samples 15 and 16 were produced except that the bismuth-based glass frits M and N were used, and the contact resistances thereof were obtained. The results are shown in Table 2.

As shown in Table 2, the contact resistances were improved by adding silver to the bismuth-based glass frits, but were higher than those obtained when the tellurium-based glass frits were used.

The invention claimed is:

1. A conductive paste comprising a conductive powder containing at least one of copper and nickel as a main component, a glass frit, and an organic vehicle, wherein the glass frit is a tellurium-based glass frit that essentially does not contain any lead component and contains tellurium as a network former in an amount of 35 to 70 mol % in terms of oxide, the tellurium-based glass frit containing silver as an essential component.

2. The conductive paste according to claim 1, wherein the tellurium-based glass frit contains the silver in an amount of 3 to 40 mol % in terms of oxide in proportion to the entire tellurium-based glass frit.

3. The conductive paste according to claim 1, wherein the tellurium-based glass frit contains at least one of tungsten and molybdenum.

4. The conductive paste according to claim 1, which is used in the formation of an electrode of a solar cell.

* * * * *